United States Patent [19]

Jones

[11] 4,399,377
[45] Aug. 16, 1983

[54] SELECTIVELY OPERABLE BIT-SERIAL LOGIC CIRCUIT

[75] Inventor: Edwin V. Jones, Colchester, England

[73] Assignee: National Research Development Corporation, London, England

[21] Appl. No.: 114,320

[22] Filed: Jan. 22, 1980

[30] Foreign Application Priority Data

Jan. 23, 1979 [GB] United Kingdom ................ 7902358

[51] Int. Cl.$^3$ .................. H03K 19/20; H03K 19/003; H03K 19/086; H03K 19/173
[52] U.S. Cl. .................................. 307/465; 307/443; 307/467; 307/480; 307/289
[58] Field of Search ........ 307/291, 440, 445, 465–469, 307/480, 443, 272 R, 272 A, 289, 243

[56] References Cited

U.S. PATENT DOCUMENTS

| | | | |
|---|---|---|---|
| 2,942,192 | 6/1960 | Lewis | 307/440 |
| 3,818,202 | 6/1974 | Ellison | 307/465 X |
| 4,088,903 | 5/1978 | Jones | 307/291 |
| 4,160,173 | 7/1979 | Aoki | 307/291 |
| 4,175,241 | 11/1979 | Tsuchiya et al. | 307/291 |

FOREIGN PATENT DOCUMENTS

| | | | |
|---|---|---|---|
| 1276203 | 9/1968 | Fed. Rep. of Germany | 307/208 |
| 1278373 | 6/1972 | United Kingdom | 307/291 |
| 1316319 | 5/1973 | United Kingdom | 307/291 |
| 1398237 | 6/1975 | United Kingdom | 307/291 |

Primary Examiner—Larry N. Anagnos
Attorney, Agent, or Firm—Cushman, Darby & Cushman

[57] ABSTRACT

A logic circuit arrangement providing logical operations on serial data. The clock-controlled arrangement can transfer data bits internally either unchanged or subject to selected logical action and can thereby perform combinational and sequential logic on data bits, or resultant outputs, transferred at different points in time. In one form using semiconductor techniques a circuit arrangement (FIG. 11) is operated by mode controls M and clock controls C to transfer data bits unchanged or subject to logical action from inputs D, $\overline{D}$ to outputs Q, $\overline{Q}$. A return signal path providing a time interval (FIGS. 3 and 4) and a mode controlled forward signal path (FIGS. 3 and 4) form a typical arrangement in which each clock signal processes an input data bit.

16 Claims, 13 Drawing Figures

| MODE CONTROL | | FORWARD PATH OPERATION | NOTATION |
|---|---|---|---|
| CLOCK | COPY | ACCUMULATE | | |
| YES | YES | NO | COPY INPUT | c |
| YES | NO | YES | LOGIC ACTION | a |
| NO | IRRELEVANT | | HOLD OUTPUT | h |
| IRRELEVANT | | | IRRELEVANT | x |
Fig 1
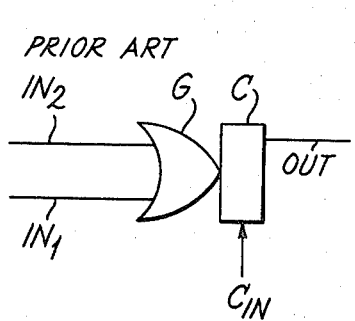
Fig. 2
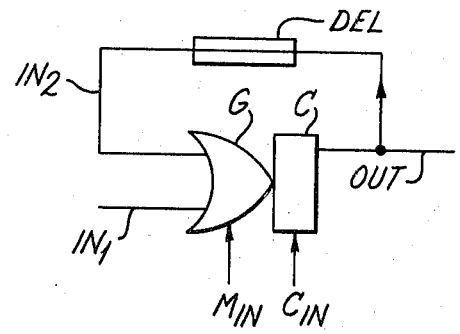
Fig. 3
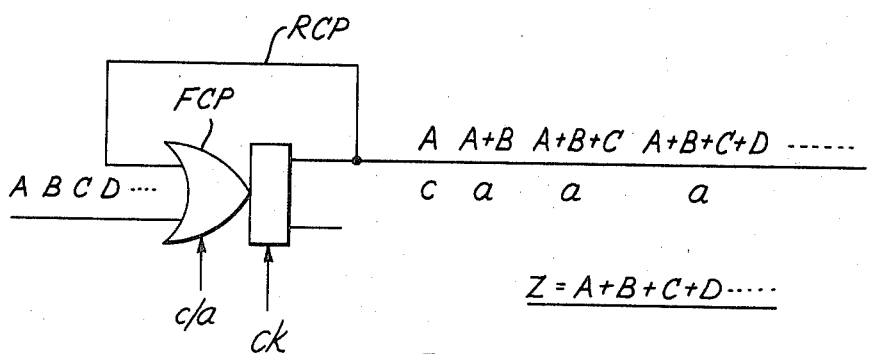
Fig. 4

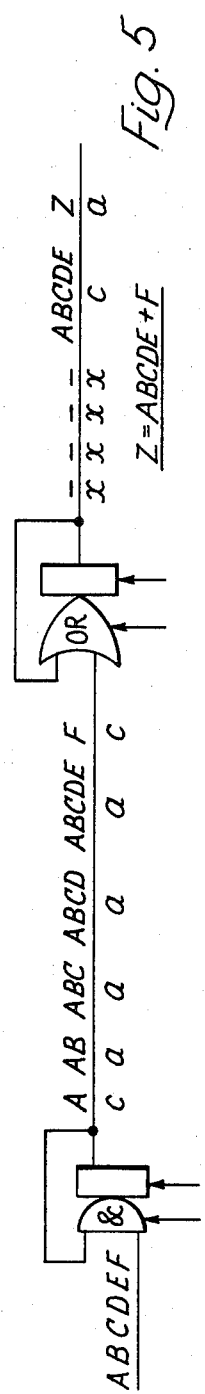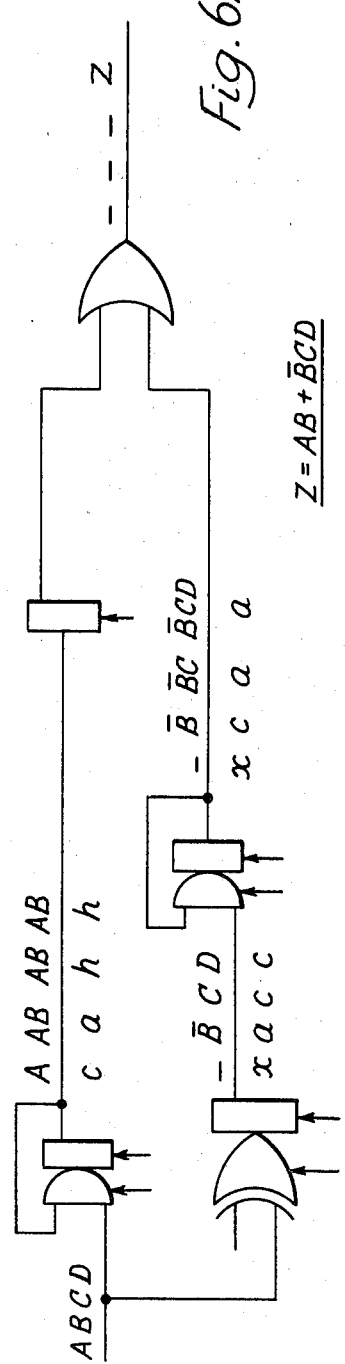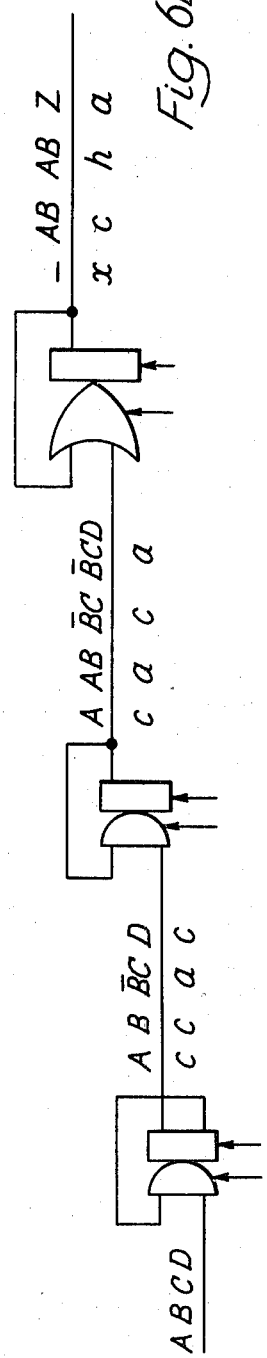

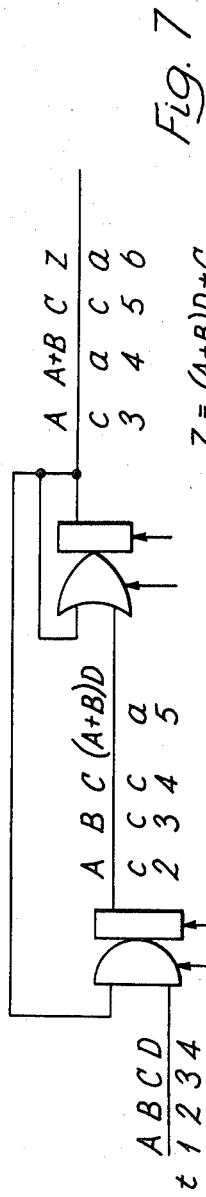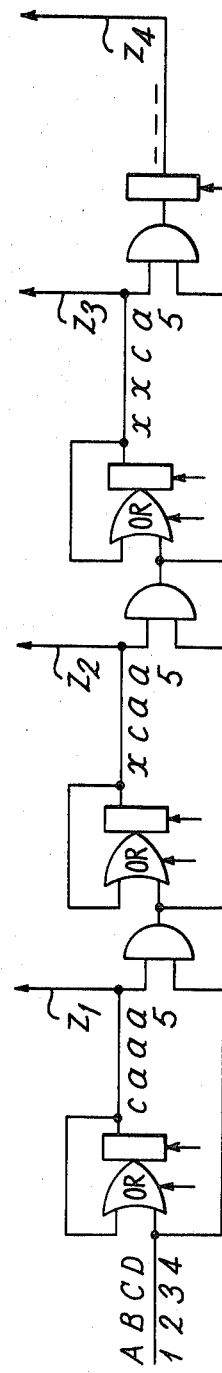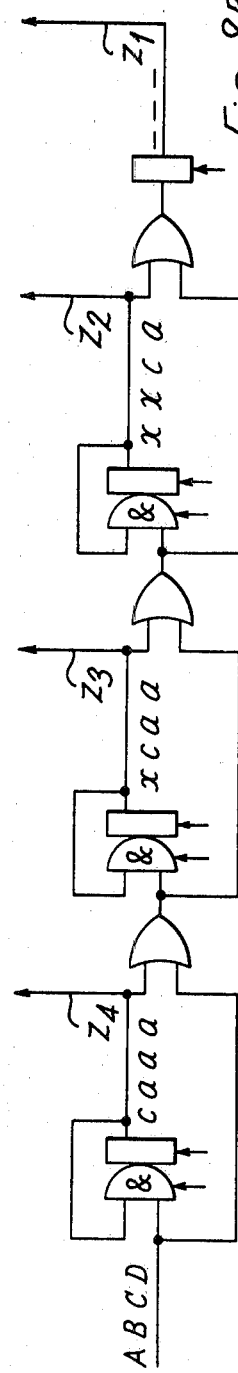

SELECTIVELY OPERABLE BIT-SERIAL LOGIC CIRCUIT

This invention relates to circuit arrangements to carry out logical operations, and particularly for serial data in computer operations at speeds where circuit propagation or response time become significant.

It is known that logic circuit elements and associated circuitry can take a finite time to operate. When this time is a significant part of the time for carrying out an operation, then errors are possible since incorrect logic states may be brought together. UKPS No. 1278373 refers to one aspect of this problem arising in circuits which determine a logical condition by sampling. To reduce this problem it has been proposed that the elements, such as gates, should be controlled by a clock pulse so that delays cannot cause variations in the time at which a logical operation is carried out on logical conditions applied to the inputs in parallel at the same instant. UKPS No. 1532764 is an example of this approach. Such elements are commonly semiconductor switching circuits but other materials and media, such as fluidics, magnetics and optics may be used.

The synchronised operation achieved in this way, while more reliable, is more expensive in terms of components and longer operational cycles and demands a parallel input. These consequences can be a serious problem in telecommunications where serial-to-parallel conversion is often additionally needed before logical operations are carried out.

It is an object of the invention to provide improved logic circuit arrangements for serial inputs.

According to the invention there is provided a logic circuit arrangement for performing logical actions on supplied serially organised data to provide a data output, the arrangement including a clock controlled gate circuit element having at least two inputs and at least one output, a forward circuit path from input to output selectively operable in at least two modes, a first, copy, mode to respond to an input logic condition of supplied data and provide said condition unchanged at a said output and a second, logical action, mode to respond to an input logic condition of supplied data and provide a logical output condition in dependence on said input logic condition, other input logic conditions of said serially supplied data and the appropriate logical action of the path in said mode.

In this way one clock pulse interval may be saved.

Preferably the arrangement includes a return circuit path having a signal processing arrangement with a finite controlled time interval of operation to return the output condition to the input of the element after the lapse of said interval.

By selection of clock and mode control signal conditions other actions, such as hold, may be performed.

According to a particular aspect of the invention at least one circuit arrangement as described above may be linked with at least another clock controlled gate element which is preferably also a mode controlled gate element by a further suitable return time-interval circuit path around both of said at least one and said at least another element.

The arrangements can be constructed in any suitable circuit form including emitter coupled, TTL, CMOS, thick film hybrid and other techniques.

According to another aspect of the invention, there is provided a logic circuit arrangement for performing logical actions on supplied serially-organised data to provide a data output, the arrangement including circuit means selectively operable on a data bit-by-bit basis in a plurality of modes including transferring a data bit unchanged and the holding of an output condition for logical action with an earlier or later occurring data bit, whereby the output is the result of accumulating serially occurring data bits and carrying out combinational logic thereon.

The arrangement may include a bistable semiconductor switching circuit having output ports switchable to alternative output conditions in response to a clock signal input and a plurality of logic operation semiconductor switching circuits in series-parallel combination together providing parallel paths from the output ports to a constant current source common to a series-parallel combination and the bistable circuit, the logic operation circuits having data inputs selectively effective to condition the series-parallel paths to perform logical operations on data applied to the remaining data inputs.

The arrangement may include in the series-parallel combination a mode control emitter-coupled pair of semiconductor devices effective to condition the combination to one or other of two parallel paths from said outputs to said constant current source whereby a copy or accumulate mode is provided by the arrangement.

According to a further aspect of the invention there is provided a bistable circuit including first, second and third pairs of transistors the transistors within a pair having their emitters connected together; collectors of a first transistor of each pair connected by a current path and arranged to share a common load circuit; collectors of a second transistor of each pair connected by a current path and arranged to share a common load circuit; a fourth pair of transistors with emitters connected together and collectors being respectively connected to the current paths between the emitters of the second and third pairs of transistors; respective feedback paths between the collector of the first transistor of the first pair and the base of the second transistor of the first pair and between the collector of the second transistor of the first pair and the base of the first transistor of the first pair; a fifth pair of transistors with emitters connected together and collectors being respectively connected through level shifting networks to the current paths between the emitters of the second and fourth pairs of transistors; means of applying serially organised data signals or bias signals to a first transistor of the second, third, fourth and fifth pairs; means of applying clock signals to switch current from a transistor of the first pair to a transistor of the fifth pair in dependence upon the state of the data signals; means of applying clock signals to switch current from a transistor of the fifth pair to a transistor of the first pair in dependence upon the state of said feedback paths.

Embodiments of the invention will now be described with reference to the accompanying drawings in which:

FIG. 1 is a table identifying various signal combinations with their notation, as made effective by embodiments of the invention, FIG. 2 is a diagram of a known clock controlled gate;

FIG. 3 is a diagram of an arrangement embodying the invention;

FIGS. 4 to 9 show various logic circuit arrangements based on FIG. 3,

Figure 9A:
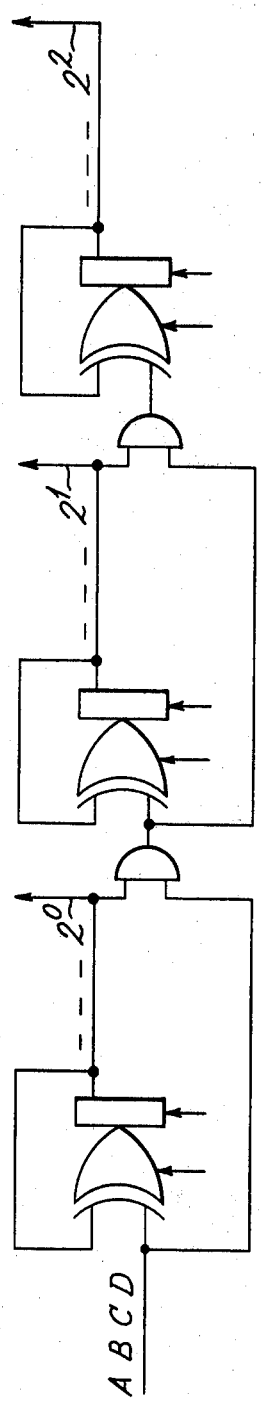

Referring firstly to FIG. 2 this shows a known gate element G and associated clock-control unit C. This element and the unit are in any suitable semiconductor or other electronic circuit constructional form to carry out logical actions on distinct data conditions simultaneously present at inputs $IN_1$, $IN_2$ (and others if these inputs are provided). As is well-known, the logical action is set by the nature of the gate and is brought about in a forward circuit signal path through the gate G by the occurrence of a clock signal on input $C_{in}$ with data conditions as inputs $IN_1$, $IN_2$ as appropriate to produce consequent logical condition at output OUT.

FIG. 3 shows a circuit arrangement embodying the invention in that a delay unit DEL of any suitable form is connected from output OUT to one input, e.g. $IN_2$, in a return circuit path so that data conditions present sequentially or serially at another input, $IN_1$, can be subjected to logical action. The clocking action is retained here. In this way the logical action $$Z = A + B + C + D \tag{1}$$

can be achieved after five clock steps when inputs A,B,C,D, are applied serially to the input and Z is the output. Five steps are required as the output at the first step must be put to ZERO, the next four steps carrying out the logical action.

The circuit arrangement of FIG. 3 embodies a particular aspect of the invention by which additionally a new input connection is applied, $M_{in}$, to gate element G. In this use the initial clock pulse, for the first step, can be saved.

Input connection $M_{in}$ permits a mode control signal to be applied to gate G to set it and especially a forward circuit path therein into one of two modes. In one mode, called accumulate and identified in FIG. 1 as a, the forward circuit signal path of gate element G operates as described above to carry out a logical action on the input signals. In the other mode, called copy and identified in FIG. 1 as c, the data condition on input $IN_1$ is copied to the output OUT without any logical action occurring in the forward circuit signal path. This copying action, and the accumulate action, are controlled in timing by the clock signal. Such a mode selection action is not possible with the FIG. 2 arrangement. Two other actions are possible with the arrangement of FIG. 3. The output is held at its last condition, identified as h in FIG. 1, in the absence of a clock signal whatever mode control signal is applied or varied. If the output is not required for further action it can be allowed to change or remain without significance as can the inputs. This condition is identified as x in FIG. 1.

The condition a or c or h or x beneath each output state refers to the clock and mode control signals required to produce that state. Note that a clock pulse must be applied whenever an input signal is to influence an output state. In FIG. 4 the mode-controlled gate is shown in a simplified form used hereafter. The forward path is identified as FCP. The output state A is delayed by one clock pulse relative to the applied condition A. This, of course, is precisely analogous to the delay effect of a conventional bistable. Note also that in order to simplify the drawing the delay element in the return circuit or feedback path RCP has been omitted. In one realisation of the circuit a master/slave bistable element or some equivalent timing arrangement is used for this purpose.

The realisation of the Boolean expression:

$$Z = ABCDE + F \tag{2}$$

for a serial data input is now considered. The accumulating logic approach leads to the arrangement of FIG. 5. The input data is presented serially (A first) to an accumulating AND gate which after 5 clock pulses gives the partial result ABCDE. This is then copied by the OR gate while the AND gate copies the input condition F. It then remains during the final clock pulse of the cycle for the OR gate to compute and output the result Z. As shown Z only appears for one clock pulse in every six. However, the OR gate is only required for the last two clock pulses of each data input word and so by changing the x conditions to 'hold' each result can be available for 5 out of every 6 clock pulses.

Clearly there are differences in performing a serial rather than parallel processing operation. The serial approach yields a simpler processing path for the data and hence should be beneficial for high rate or complex systems, but at the expense of requiring mode control and clock signals for each gate. These control signals take the form of preselected sequences locked to the incoming word rate and could be provided by a programmable read only memory for example. (The system of FIG. 5 would require 3 such control signals: a continuous clock supplied to both gates, a sequence to give caaaac for the AND gate and, making use of the x condition, the complement of this could be used for the OR gate.)

Two realisations for the Boolean expression $$Z = AB + \overline{B}CD \tag{3}$$

are now described.

The variable B appears twice and so a basic approach would be to resort to two signal paths as shown in FIG. 6A. The lower path uses a programmed inversion which involves permanently setting a logical 1 on the feedback input of an accumulating-exclusive-OR gate. This path produces the partial result $\overline{B}CD$ while the upper path gives AB. A delay is required in the upper path so that the two partial results may be logically combined in the final 2-input OR gate. This OR gate could either be a conventional combinational gate, or a clocked version (e.g. an accumulating gate without its feedback connection) or simply a 'wired OR' may be feasible.

A better realisation for Z which requires only a single path is shown in FIG. 6B. This is achieved by feeding back the inverted output of the first gate. The steps involved are indicated on the diagram.

This particular example forms part of a design for a high speed transmission code converter. Such a code converter is a good example of the requirement to convert a continuous serially organised stream of data words into another serial stream. Conventional approaches generally involve processing in parallel forms so great care is needed if some of the problems outlined earlier are to be avoided. Code converters using accumulating logic principles would operate serially in a strictly time ordered environment such that speed limitations should be essentially determined by the capability of the individual gates.

The realisation of an expression such as:

$$Z = (A + B)D + C \tag{4}$$

in which D must be processed before C may be by a two path technique. However, by employing feedback over more than one stage an effective re-ordering of the constituent operations is possible, and for this particular example a single path is sufficient. The arrangement is detailed in FIG. 7. The numbers in parenthesis associated with each clocking operation refer to time slots counting the arrival of A at the input as the first (1). The feedback connection over both stages is active in time slot (4) when D and A+B are simultaneously applied to the first gate. The result (A+B)D appears at the output of the first gate in time slot (5). Note that like the previous examples the action of the circuit can be continuous in that the next data word could be applied in time slots (5) onwards, thus saving a clock pulse interval.

The arrangement described with reference to FIG. 4 is particularly useful in performing threshold logic (and so majority logic) operations on serial data streams. A realisation of output conditions $Z_1$ to $Z_4$ related to the input variables as follows is now described:

$Z_1 = A+B+C+D$ (i.e. at least 1 'one' present)

$Z_2 = AB+(A+B)C+(A+B+C)D$ (i.e. at least 2 'ones' present)

$Z_3 = (A+B)(AB+C)(ABC+D)$ (i.e. at least 3 'ones' present)

$Z_4 = ABCD$ (i.e. all 4 'ones' present).

As the data is presented in serial form, the accumulating logic gates can be used to perform the required successive AND OR manipulations. In this way it is possible to replace each 'diagonal' of conventional combinational gates with a single accumulating element. FIG. 8A demonstrates this approach using accumulating-OR gates and 2-input AND gates, for a serial data word of 4 variables. The required output relationships $Z_1$ to $Z_4$ all appear in time slot (5) as shown in the diagram. The control requirements for each accumulating gate are also shown but to simplify the drawing the intermediate output conditions have been omitted.

FIG. 8B achieves the same result but uses accumulating-AND gates and 2-input OR gates. Again all results appear in time slot (5) only now the order of computational complexity is reversed, $Z_4$ being the easiest.

With appropriate modification to each control sequence the arrangement is readily extendable to any length of input word by simply adding on an extra stage for each extra input variable. If only some of the output conditions are required then the choice between the accumulating-AND and accumulating-OR based approaches can lead to some very economical realisations. The efficient realisation of majority-logic functions is perhaps of particular interest.

It should be noted that in the systems of FIG. 8 the last input state (D in these samples) must propagate through all three unclocked logic gates in rather less than a clock pulse period. In practice this puts a limit on the maximum clock rate, a limitation which will become more severe as the number of stages in the system increases. If necessary this 'trickle through' problem can be overcome by using clocked gates throughout. The cost of doing this is serial processing delay; the sequence at each output port will be delayed by one clock pulse relative to the sequence at the previous output port.

For counting input data in serial form, one possible arrangement would be to use accumulating-exclusive-OR gates. This approach is shown in FIG. 9A where the binary coded outputs indicate the number of 'ones' present in the incoming 4 digit word. The control signals required have been omitted as they are identical to those of FIG. 8A, similarly, the binary coded output is available in time slot (5). The system is of course extendable to handle input words of any length. Additionally, the comments made above regarding 'trickle through' problems in accumulating threshold logic systems, together with the suggested solution, will also apply here.

Figure 9B:
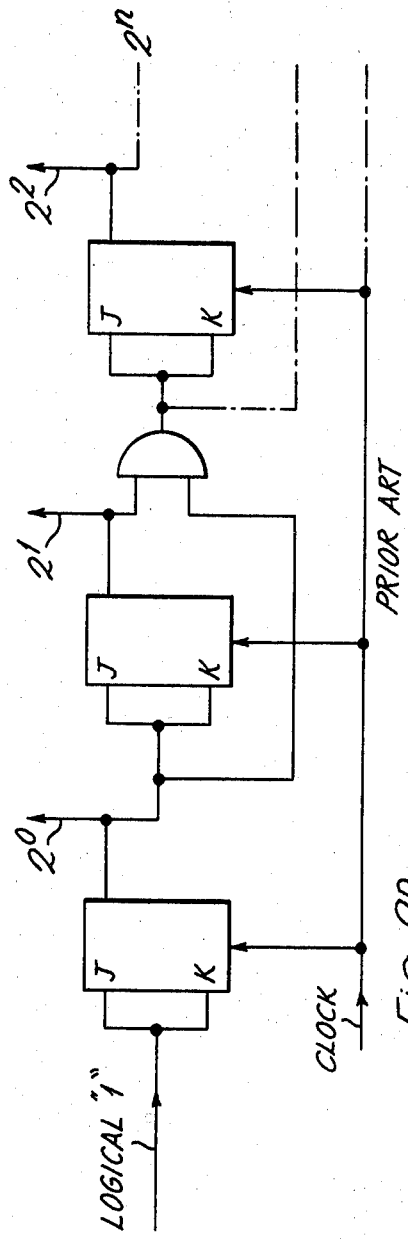

A conventional form of synchronous binary counter is shown in FIG. 9B. The operation of the two systems is clearly different in that in FIG. 9A a count is made of the number of 'ones' present in an input word of given length. It is also observed that the copy mode of the accumulating gates of FIG. 9A in effect avoids the reset operation necessary in the conventional synchronous counter before the next count can commence.

Detailed aspects of gate circuit design will now be considered. Efficient logic element design at both the system and gate level must be considered simultaneously. This becomes particularly necessary when designing high speed systems. The following relates particularly to the design of semiconductor embodiments but does not exclude embodiments in other techniques e.g. fluidics, magnetics, and optics, to name some.

Each clocked logic gate of FIG. 2 could be realised simply by cascading a conventional combination logic element for gate G and a bistable circuit for unit C. For high speed digital processing this has two limitations:
(i) The serial processing delay through the two cascaded elements will limit the maximum clocking rate.
(ii) The input and output ports to the logic gates will generally involve only single sided (i.e. non-complementary) signals. However, if balanced signals could be employed throughout, then for fast digital processing a worthwhile speed advantage would be gained.

Provision of the combinational logic functions as an integral part of a modified bistable circuit could have advantages in both these respects. A logic array using this approach would thus resemble a series of shift registers in which the component bistable elements were either acting as straight timing delays or as clocked combinational logic gates. Known designs for digital processing at high speeds use bistables connected either as straight shift registers or involving linear combinational feedback. The clocked nature of each contributing operation and the availability of balanced drive where required ensure good waveforms and therefore high operating speeds. The limitations of these known designs are that only certain groups of functions can be realised and that the configurations required are generally not easily deduced from (say) a Boolean design expression.

The clocked logic approach of the circuits described with reference to FIG. 3 makes use of the advantages to be gained from shift register configurations and yet permits direct realisation of simple Boolean functions.

Figure 10:
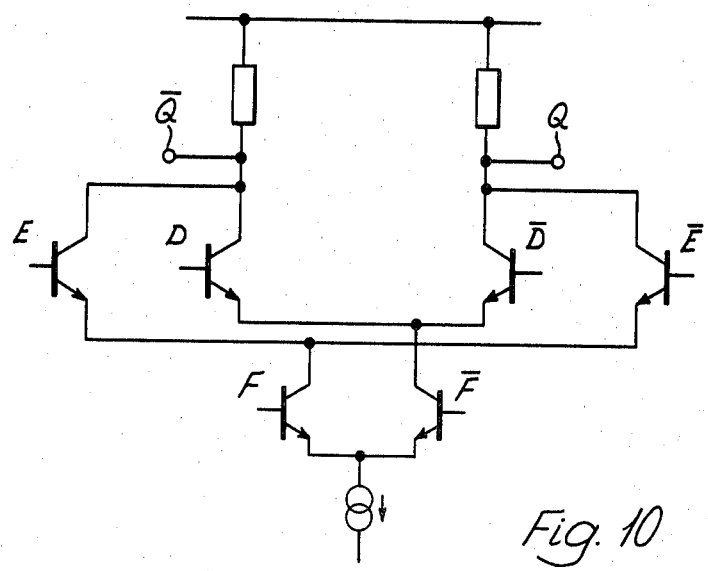
FIG. 10 shows a logic circuit.

At present emitter coupled logic (e.c.l.) is favoured for fast digital processing and therefore it is appropriate to consider, by way of example, possible solutions to the above requirements in terms of the current steered emitter-coupled design philosphy. FIG. 10 shows how this circuit technique can be used to realise a universal balanced drive combinational gate for parallel inputs. For clarity, biasing and level shifting circuits have been omitted. The operation of this circuit can be described by the Boolean expression:

$$Q = D\overline{F} + EF \quad (6).$$

The circuit is a general purpose combinational logic gate in that by appropriate biasing or interconnection of inputs ports the logic functions AND, OR and exclusive-OR can be realised:

AND function: $Q = D\overline{F}$ when $E = O$ (and $\overline{E} = 1$)

OR function: $Q = D + F$ when $E = 1$ (and $\overline{E} = 0$)

exclusive-OR function: $Q = D \oplus F$ when $E = \overline{D}$ (and $\overline{E} = D$)

alternatively,

AND function: $Q = EF$ when $D = 0$ (and $\overline{D} = 1$).

The inverse functions are of course available simultaneously from output port $\overline{Q}$. Similarly, the complementary nature of the input ports enables a number of other associated functions to be realised.

Figure 11:
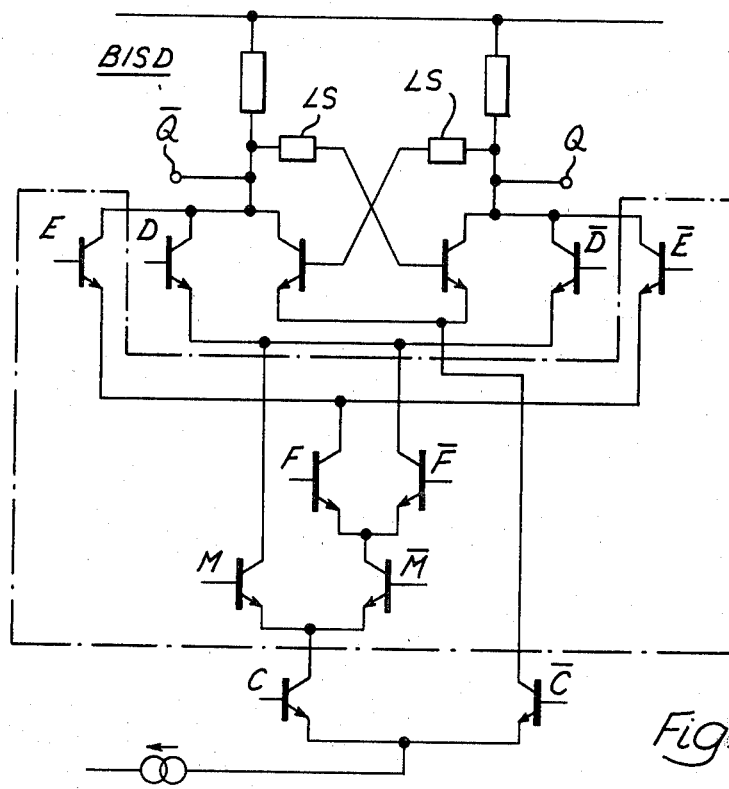
FIGS. 11, 12 and 13 show semiconductor arrangements, all embodying the invention.

The e.c.l. logic circuit of FIG. 10 is of particular interest when one considers its incorporation into an emitter coupled bistable circuit, the 'D-type' bistable to be found in most integrated circuit e.c.l. families. FIG. 11 shows BIS D, such a bistable, and, inside the chain-dotted outline, additional components to incorporate it into an embodiment of the invention. Suitable level-shifting and cross-coupling arrangements, indicated at LS, are well-known in the art and are not shown. Typical suitable arrangements include passive resistor bias chains, as used in e.c.l. integrated circuits, or active devices such as transistor level shifters.

In a typical example of the invention using the circuit of FIG. 11 transistors of the BFR93 type have been used. The circuit was arranged so that the constant current was about 20 mA and collector load resistors each 50 ohms. With these settings a toggle frequency of 1000 MHz can be achieved. The rise and fall times of the transitions are each about 400 pico seconds in duration.

It will be seen that a general purpose clocked combinational gate has been achieved without greatly increasing the circuit complexity. The Boolean expression for this circuit is:

$$Q^+ = \overline{D F} + EF \quad (7)$$

where $Q^+$ denotes the state of output port Q after application of a clock pulse.

The propagation delay through the modified bistable circuit will not be significantly greater than that through the original bistable circuit, although it must be recognised that there will be extra capacitance associated with the output ports and the clock signal must take a more devious path. Known circuit modifications can help in this respect. The circuit clearly has the advantage that the clocking signal is closely associated with the combinational manipulations and therefore, in a complex array of gates, it will enable a tight control to be kept over the timing of each contributing operation.

To accommodate the extra variable which selects the 'copy' or 'logic' modes of operation equation (7) may be modified to:

$$Q^+ = D(\overline{FM} + M) + EF\overline{M} \quad (8)$$

wherein: $M = 1$ gives the copy mode (in in which D is copied) and $M = 0$ gives the logic mode of equation (7) (this becomes the 'accumulate' mode when an output to input feedback path is provided).

This equation again represents a general purpose combinational logic gate where in the 'logic' mode appropriate biassing or inter-connection of input ports yields various logic functions.

At the expense of generality or speed performance, various simplifications can be made to this circuit. For example, if the exclusive-OR function is not required, the transistors associated with E and $\overline{E}$ may be omitted. Additionally, logic levels can be saved by resorting to single-sided drive for the clock and mode controls, but this would be at the expense of circuit waveforms and so would reduce the maximum speed of operation.

The requirement to perform logic operations on a serial data stream is thus met by the accumulating logic gate, whereby the output state of a storage element is logically combined with an input state to give a new output condition. To illustrate a possible approach, consider the general purpose circuit of FIG. 11 the operation of which is described by equation (8). Feedback is clearly necessary to achieve the required interaction between output and input. For reasons of speed of operation, feedback is provided from the outputs to the F (and $\overline{F}$) input ports and, following the notation of conventional D-type bistables for parallel operations, the serially organised data is applied to the D (and $\overline{D}$) input ports.

Figure 12A:
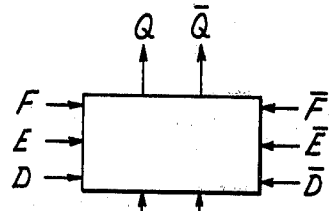
Figure 12B:
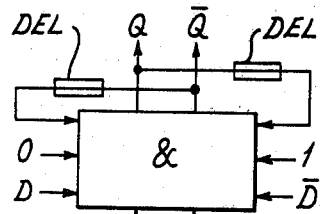
Figure 12C:
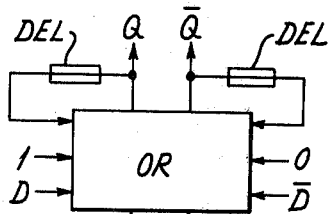

FIG. 12a is a symbolic form of FIG. 11 and FIGS. 12b, 12c and 12d respectively shown the bias and feedback connections of FIG. 12a which yield the accumulating functions AND, OR and exclusive-OR. Element DEL is a delay as mentioned above, of any suitable form. In the accumulating mode of operation (M=0) the Boolean expressions for these functions are:

AND function: $Q^+ = \overline{Q} \cdot D$ when $E = 0$ and $F = \overline{Q}^-$ OR function: $Q^+ = Q^- + D$ when $E = 1$ and $F = Q^-$ exclusive-OR function: $Q^+ = Q^- \oplus D$ when $E = D$ and $F = Q^-$ where $Q^-$ and $Q^+$ are the output states of the circuit respectively before and after application of a clock pulse.

In the copy mode of operation (M=1) on the application of a clock pulse for all functions: $Q^+ = D$.

The above treatment is quite general and although in terms of emitter coupled logic could clearly be realised in other discrete component or integrated circuit forms as well as in optical, magnetic and other logic elements.

An important feature of the accumulating technique is its speed potential. An accumulating logic gate based on a bistable can be very fast because decisions regarding signal routing can be made before the next data input arrives. For the AND and OR function, the decision to be made for both the copy and accumulate modes of operation is either 'copy the next input' or 'ignore the next input'. For the circuit approach given this simply means either using the circuit as a conventional D-type bistable or inhibiting the next clock pulse. The required copy/ignore state can thus be set up as soon as the output condition has settled and does not have to await the arrival of the next data input.

Figure 13:
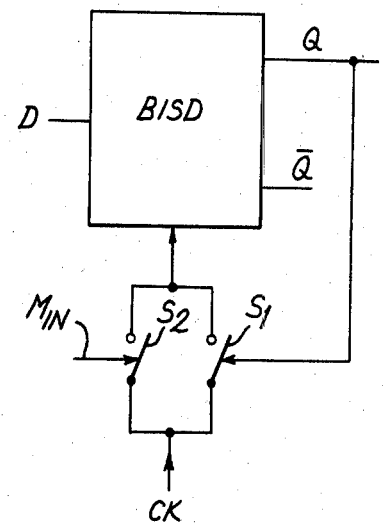
Figure 12D:
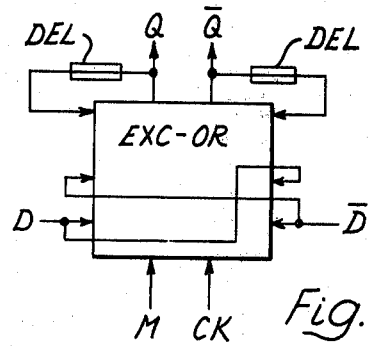

The circuit requirements can be expressed in the form given in FIG. 13, where switch $s_1$ is controlled by the bistable output condition and switch $s_2$ by the copy/accumulate mode signal. The clock and mode control signals are independent of the applied data patterns and so some allowance may be made for serial processing delays up to the points where these signals interact. Speed limitations will be determined by the loop delay from Q via the 'switch' $s_1$ and back into the bistable and, or course, by the fundamental shift rate limitations of the bistable itself.

The exclusive-OR function can also be provided by the invention in one stage. The decision to be taken for this function 'copy the next input' or 'invert the next input' independence on Q. This decision is taken by an additional programmable invert facility at the input controlled by output Q. Here again the required signal routing conditions can be set up before the next data input arrives. The exclusive-OR circuit is especially useful when performing logical manipulations on serially presented data in that the 'copy or invert' operation gives a programmable invert facility, the use of which has already been demonstrated.

The techniques embodying the invention described above provide an 'accumulating' logic mode in which all the basic Boolean logic operations can be performed on serially presented data. This is specially useful for high speed processing. The significant advances and advantages of this accumulating logic mode may be summarised as follows:

(i) Hazard free operation. All manipulations, whether feedforward or feedback, are performed under the direct control of clock signals. Thus effects such as pattern and path dependent propagation delays, waveform edge jitter and race conditions are dealt with at the design stage. This means that it will generally be possible to design a system so that the the speed of operation is related to the performance of individual circuit elements and is not a function of the complexity of the overall system.

(ii) Direct serial processing. The essentially serial operations involved are compatible with the data formats of transmission and data switching systems and other such arrangements where logical manipulations are to be performed on serially organised inputs. However, as the examples given earlier demonstrate, direct serial processing is only achieved at the expense of overall input-to-output delay, often amounting to several clock pulse periods. Additionally, in contrast to a parallel input combinational logic approach, circuits have to operate at the serial input clock rate. The examples given consider only a single serial input stream. The approach is of course extendable to multiple inputs, in for example, the realisation of serial adders and multipliers.

(iii) A separate resetting action, at the end of each word or partial result within the pipelined system, is avoided by the copy facility. Control signal complexity is increased in doing this.

(iv) Economical realisation. Each accumulating logic gate requires a clock signal and a copy/accumulate mode control signal which has to be related to the word structure of the incoming data stream. The paths associated with the data waveforms will generally be fairly simple, and so potentially fast, but this is achieved at the expense of having to provide timing control signals. Some form of word generator (a read-only memory, for example) is needed to supply the appropriate control signals to each gate. This probably only becomes attractive when the data words are long or when a significant number of gating operations are to be performed, in which case there may be opportunity for sharing of some of the control signals. Within these terms, as the threshold logic examples show, the continuous processing which becomes possible on a serial data stream can lead to some impressively efficient realisations. Hardware efficiency is, or course, related to design efficiency, and at present a formal design method has yet to be developed. The step-by-step action of the pipelined combinational circuits may suggest a design approach based on Boolean Algebra and its well developed minimisation techniques. However, both time and sequence must also be taken into account and here the problems are analogous to those already cited for sequential logic systems. At present, a mix of intuition and combinational logic design methods is being used. For simple examples at least, the step-by-step nature of the accumulating technique makes processor synthesis reasonably straightforward.

(v) Hardware orientated design involving a minimum set of logic circuit types. An uncommitted array of accumulating logic gates could be envisaged together with a series of programmable word generators. Appropriate interconnection of the gates and programming of the word generators could yield an extensive set of Boolean transfer characteristics. The gates provided could either be synthesised from existing bistables and combinational gates or could use specially fabricated accumulating logic circuits. The universal accumulating logic element based on the emitter coupled bistable as outlined above appears particularly attractive especially where there is a requirement for very high speed operation.

(vi) Jitter does not accumulate during the processing of a signal.

A particular facility afforded by embodiments of the invention is that the logical function performed by the circuit can be changed during the processing of a signal. The change can be obtained by the alteration of the function control signals in accordance with an external command for example from a store or register. Alternatively an auxiliary circuit can be coupled to the function control terminals and determine their inputs and therefore the logical function in dependence on the signals arriving at the input. The auxiliary circuit may include logic elements to carry out a logical operation on the input signals and change the logical function of the main circuit once a chosen input condition has occurred. The logic elements may be simple or complex, to respond to several different input data elements and derive a logical condition from them to use to determine the function of the main circuit.

Such an arrangement is most useful for signal handling or processing telecommunication systems. For example a fast up/down counter, such as is required in high speed code translations in telecommunication, may be controlled by selection of the copy of accumulate modes. Further a telecommunication signal in the form of a "header", or routing instruction, and a message could be arranged to control its own routing. The "header" would set up the function and (or mode) of the routing circuits of the above form in the manner just described. Additionally, feed-back from some point along the circuit arrangements could also control the function if required.

The generation of mode control for the logic circuit arrangement can be achieved in various ways. In one way combinational gates and a clock stage are used with an external copy/accumulate control, supplied for example from a microprocessor. In another way patterns required for mode control are generated by circuits provided on the same l.s.i. chips as the combinational gates. This permits a significant reduction of the number of external interconnections in comparison with the number of conventional parallel arrangements.

I claim:

1. A logic circuit for performing at least one selected logical action on supplied serial data bits to provide a data output signal, said circuit including:
   a clock-controlled selectable-mode gate circuit means, responsive to a mode control signal applied thereto and having at least a first input terminal respective of signals indicative of said serial data bits, and at least one output terminal, for providing a forward circuit path from said first input terminal to said output terminal selectively operable in at least a copy mode and a logical action mode;
   said copy mode comprising, providing the instantaneous supplied serial data bit at said first input terminal unchanged at said output terminal;
   said logical action mode comprising generating a signal at said output terminal indicative of the instantaneous serial input data bit in predetermined Boolean logic combination with at least one previously occurring data bit.

2. A circuit arrangement according to claim 1 in which only one clock pulse is required for each serial data input bit of a bit series to carry out a logical action on the bits of the series.

3. The logic circuit of claim 1 wherein said gate circuit means includes a second input terminal, and a feedback circuit path coupling said second input terminal to said output terminal, said feedback circuit path including a delay device for delaying signals applied thereto by a predetermined number of serial bit periods.

4. The logic circuit of claim 3 wherein said gate circuit means includes hold means for maintaining the value of the signal at said output terminal unchanged in the absence of said clock signal.

5. The logic circuit of claim 1 wherein said first mentioned gate circuit means includes a second input terminal, and wherein said logic circuit further comprises:
   a second clock-controlled selectable-mode gate circuit means; and
   a feedback circuit path coupling said first mentioned gate circuit means to the output of said second gate circuit means.

6. The logic circuit of claim 5 wherein said serial data bits comprise telecommunication signals.

7. The logic circuit of claim 1 wherein said logic circuit is formed of semiconductor material.

8. The logic circuit of claim 1 wherein said serial data bits comprise telecommunication signals.

9. A bistable circuit including first, second and third pairs of transistors, the transistors within a pair having their emitters connected together; the collectors of a first transistor of each pair connected by a current path and arranged to share a first common load circuit; the collectors of a second transistor of each pair connected by a current path and arranged to share a second common load circuit; a fourth pair of transistors with emitters connected together and collectors being respectively connected to the current paths between the emitters of the second and third pairs of transistors; respective feedback paths between the collector of the first transistor of the first pair and the base of the second transistor of the first pair and between the collector of the second transistor of the first pair and the base of the first transistor of the first pair; a fifth pair of transistors with emitters connected together and collectors being respectively connected to the current paths between the emitters of the second and fourth pair of transistors; means for applying serially organised data signals to a first transistor of the second, third, fourth and fifth pairs; means for applying clock signals to switch current from a transistor of the first pair to a transistor of the fifth pair selected in dependence upon the state of the data signals; means for applying clock signals to switch current from a transistor of the fifth pair to a transistor of the first pair selected in dependence upon the state of said feedback paths.

10. A circuit according to claim 9 in which the means for applying clock signals comprises a sixth pair of transistors having emitters connected by a current path to share a current, the collectors of the transistors being respectively connected to current paths between the emitters of the first and fifth pairs of transistors and clock signals applied in operation to a base of a transistor of the sixth pair.

11. A circuit according to claim 10 and including data and clock signal supply terminals for the bases of appropriate transistors of the second, third, fourth, fifth and sixth pairs, the signals applied in operation to a first transistor of a pair being the complement of those applied to the second.

12. A logic circuit of the type responsive to serial input data and clock signals applied thereto, including a clock controlled gate including at least two input terminals and one output terminal for generating, in response to said clock signal, an output signal in accordance with the instantaneous states of input signals applied to said input terminals, the improvement wherein said clock controlled gate is also responsive to a mode control signal applied thereto and includes:
   first means, responsive to a first value of said mode control signal, for generating, in response to said clock signal, an output signal at said output terminal representative of the results of a predetermined Boolean logic operation on said instantaneous input signal states; and
   second means, responsive to a second value of said mode control signal, for generating, in response to said clock signal, an output signal representative of the instantaneous state of one of said input signals.

13. A logic circuit for performing logical actions on supplied serial data to provide a data output, including:
   circuit means, responsive to mode control signals and clock signals applied thereto, for selectively operating on said serial data, on a bit-by-bit basis in accordance with said clock signal, in a selected one of a plurality of modes in accordance with said mode control signal, said modes including transferring an input data bit unchanged as said output data, said modes also including selectively performing a predetermined combinational Boolean logic function on a plurality of predetermined ones of said successive bits.

14. A circuit arrangement according to claim 13 including a bistable semiconductor switching circuit having output ports switchable to alternative output conditions in response to said clock signal input and a plurality of logic operation semiconductor switching circuits in series-parallel combination together providing parallel paths from the output ports to a constant current source common to the series parallel combination and the bistable circuit, the logic operation circuits having data inputs selectively effective to condition the series-parallel paths to perform respective selected logical operations on data applied to remaining said data inputs.

15. A circuit arrangement according to claim 14 including in said series-parallel combination a mode control emitter-coupled pair of semi-conductor devices effective to condition the combination to one or other of two parallel paths from said outputs to said constant current source whereby a copy or acumulate mode is provided by the arrangement.

16. A bistable circuit including first and second pairs of transistors, the transistors within a pair having their emitters connected together, the collectors of a first transistor of each pair connected by a current path and arranged to share a first common load circuit, the collectors of a second transistor in each pair connected by a current path and arranged to share a second common load circuit, respective feedback paths between the collector of the first transistor of the first pair and the base of the second transistor of the first pair and between the collector of the second transistor of the first pair and the base of the first transistor of the first pair;

a third pair of transistors with emitters connected together and collectors being respectively connected to the current paths between the emitters of the first and second pairs of transistors;

a fourth pair of transistors with emitters connected together and collectors being respectively coupled to the current paths between the emitters of the second and third pair of transistors;

means for applying serially organised data signals to a first transistor of the second, third and fourth pairs;

means for applying clock signals to switch current from a transistor of the first pair to a transistor of the fourth pair selected in dependence upon the state of the data signals;

means for applying clock signals to switch current from a transistor of the fourth pair to a transistor of the first pair selected in dependence upon the state of said feedback paths.

* * * * *